(12) United States Patent
Lin

(10) Patent No.: US 6,399,506 B2
(45) Date of Patent: *Jun. 4, 2002

(54) METHOD FOR PLANARIZING AN OXIDE LAYER

(75) Inventor: Chingfu Lin, Taipei (TW)

(73) Assignee: Taiwan Semiconductor Manufacturing Co., Ltd., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 71 days.

(21) Appl. No.: 09/306,245

(22) Filed: May 6, 1999

(30) Foreign Application Priority Data

Apr. 7, 1999 (TW) .......................... 88105504

(51) Int. Cl.$^7$ ............................. H01L 21/302
(52) U.S. Cl. ..................... 438/706; 438/711; 438/723; 438/690; 438/691; 438/692; 438/693
(58) Field of Search .................. 438/706, 711, 438/719, 720, 722, 723, 724, 690–693

(56) References Cited

U.S. PATENT DOCUMENTS

| | | | | |
|---|---|---|---|---|
| 5,320,708 A | * | 6/1994 | Kadomura et al. | 156/662 |
| 5,506,421 A | * | 4/1996 | Palmour | 257/77 |
| 5,789,769 A | * | 8/1998 | Yamazaki | 257/263 |
| 5,854,121 A | * | 12/1998 | Gardner et al. | 438/425 |
| 5,966,598 A | * | 10/1999 | Yamazaki | 438/221 |
| 6,066,566 A | * | 5/2000 | Naeem et al. | 438/700 |
| 6,118,168 A | * | 9/2000 | Moon et al. | 257/513 |
| 6,204,146 B1 | * | 3/2001 | Jenq | 438/424 |

* cited by examiner

Primary Examiner—Benjamin L. Utech
Assistant Examiner—Charlotte A. Brown
(74) Attorney, Agent, or Firm—J.C. Patents

(57) ABSTRACT

A method of planarizing an oxide layer. The method includes performing an isotropic chemical dry etching operation using a nitrogenous processing gas. Furthermore, oxygen can also be added to the nitrogenous processing gas during the isotropic chemical dry etching operation. In addition, the nitrogenous processing gas can be nitrogen or a nitrogen-oxygen compound, where the nitrogen-oxygen compound can be nitrogen monoxide, nitrogen dioxide or nitrous oxide.

15 Claims, 2 Drawing Sheets

METHOD FOR PLANARIZING AN OXIDE LAYER

CROSS-REFERENCE TO RELATED APPLICATION

This application claims the priority benefit of Taiwan application serial no. 88105504, filed Apr. 7, 1999, the full disclosure of which is incorporated herein by reference.

BACKGROUND OF THE INVENTION

1. Field of Invention

The present invention relates to a method for planarizing an oxide layer. More particularly, the present invention relates to a method for planarizing an oxide layer using an isotropic chemical dry etching operation.

2. Description of Related Art

Conventionally, an oxide layer is planarized by performing a chemical-mechanical polishing operation. However, to produce a planar oxide layer above a highly rugged semiconductor substrate, a very thick layer of oxide must be deposited. Then, a chemical-mechanical polishing operation has to be carried out to remove the upper portion of the oxide layer so that the underlying rugged landscape is completely concealed. Since a rather thick oxide layer must be removed to obtain the desired planarity, polishing time is long and hence the cost of production will increase. Moreover, additional problems related to reliability of devices may result from lengthy polishing.

SUMMARY OF THE INVENTION

The invention provides a method of planarizing an oxide layer. The method includes performing an isotropic chemical dry etching operation using a nitrogenous processing gas. Furthermore, oxygen can also be added to the nitrogenous processing gas during the isotropic chemical dry etching operation.

According to the embodiment of this invention, the nitrogenous gas can be nitrogen or a nitrogen-oxygen compound, where the nitrogen-oxygen compound can be nitrogen monoxide, nitrogen dioxide or nitrous oxide.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
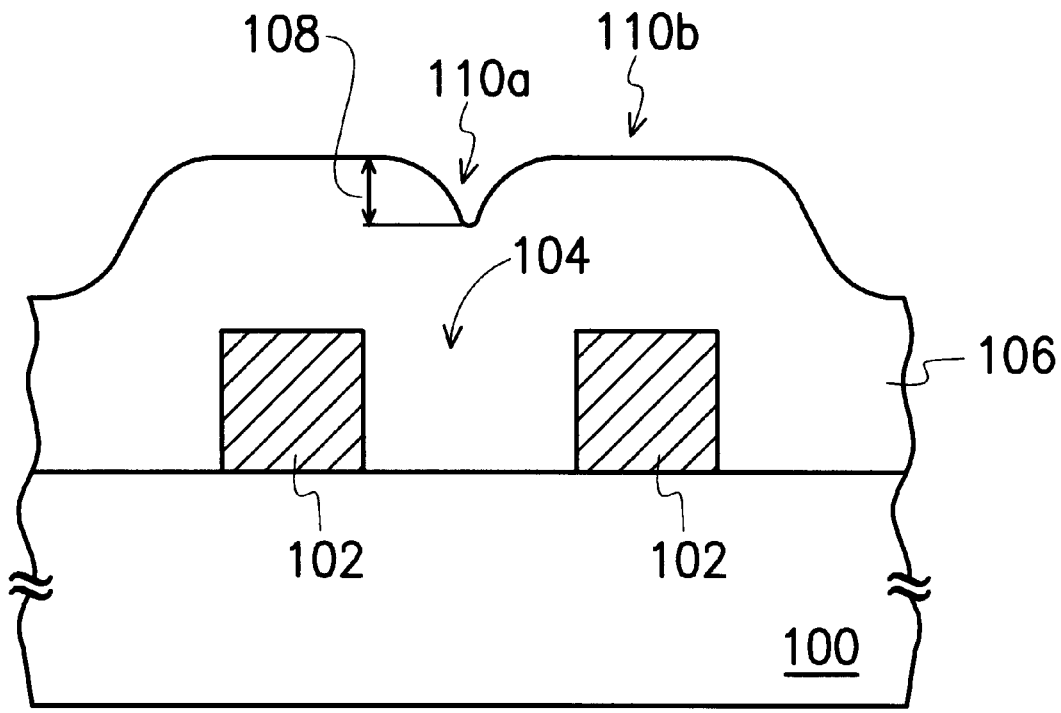
FIGS. 1A and 1B are schematic, cross-sectional views showing the steps for planarizing an oxide layer by performing an isotropic chemical dry etching operation according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In this embodiment of the invention, a method for planarizing an oxide layer above a substrate having conductive lines thereon is provided. The planarization is carried out using an isotropic chemical dry etching operation. However, the invention is not limited to such application. In fact, the invention can be applied to planarize an oxide layer deposited over any rugged substrate surface. For example, this invention can be applied to planarize the oxide layer above a MOS transistor.

Figure 1B:
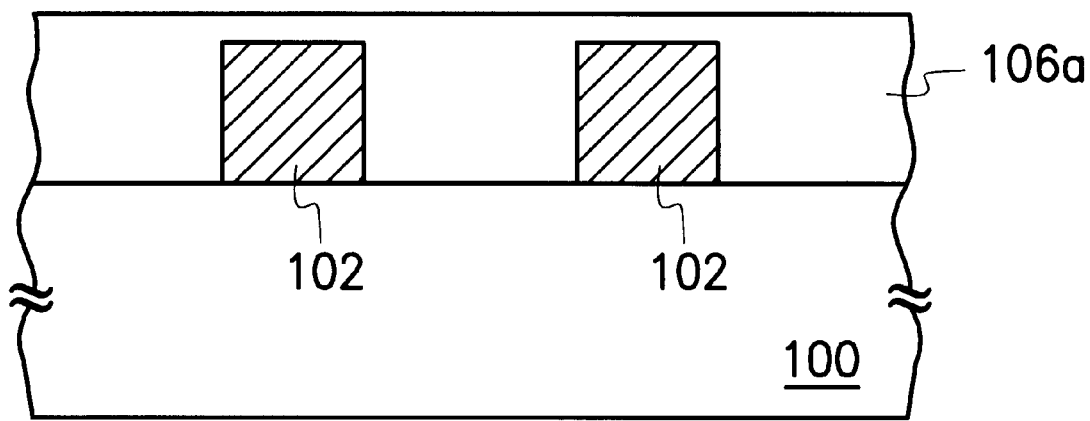

FIGS. 1A and 1B are schematic, cross-sectional views showing the steps for planarizing an oxide layer by performing an isotropic chemical dry etching operation according to one preferred embodiment of this invention.

As shown in FIG. 1A, a substrate 100 having conductive lines 102 thereon is provided. Since an opening 104 is formed between two neighboring conductive lines 102, a very rugged substrate surface is created. The substrate 100 can be a semiconductor silicon substrate having some devices, for example, MOS transistors formed therein. To simplify the diagram, these devices are not shown. Thereafter, an insulation layer 106 is formed over the conductive lines 102 and the substrate 100. Preferably, the insulation layer 106 is formed by depositing silicon oxide ($Si_xO_y$) or a silicon oxide based material. For example, the silicon oxide layer 106 can be a sub-atmospheric chemical vapor deposition (SACVD) oxide or a plasma-enhanced chemical vapor deposition (PE-CVD) tetraethyl orthosilicate (TEOS), phosphosilicate glass (PSG), borophosphosilicate glass (BPSG), spin-on-glass (SOG) or other material having similar properties. The silicon oxide insulation layer 106 not only covers the substrate 100, but some of the rugged landscape above the substrate is also reflected in the shape of the upper surface of the insulation layer 106 as well. Hence, a recess 110a is formed in region that corresponds in position to the opening 104, whereas bumps 110b are formed in locations that correspond in position to the conductive lines 102. In FIG. 1A, the step height from the bottom of the recess 110a to top of the bump 110b is labeled 108.

As shown in FIG. 1B, an isotropic chemical dry etching operation is carried out to planarize the oxide layer 106 so that an oxide layer 106a is ultimately formed. The processing gas used in conducting the isotropic chemical dry etching operation is preferably a nitrogenous gas that can be nitrogen ($N_2$) or a nitrogen-oxygen compound ($N_xO_y$). Nitrogen-oxygen compounds include gases such as nitrogen monoxide (NO), nitrogen dioxide ($NO_2$) and nitrous oxide ($N_2O$). The desired level of planarity on an oxide layer can be achieved by varying the flow of the nitrogenous gas through the reacting chamber of a dry etching station.

The amount of nitrogenous processing gas (such as nitrogen) flowing into the reaction chamber affects the degree of planarity of the insulation layer 106a after etching. Table 1 below lists out the average step heights 108 for passing various amount of nitrogen into the reaction chamber.

TABLE 1

| Volumetric Flow of Gaseous Nitrogen (sccm) | Average Step Height on Insulation Layer (nm) |
|---|---|
| 10 | 250 |
| 40 | 179 |

TABLE 1-continued

| Volumetric Flow of Gaseous Nitrogen (sccm) | Average Step Height on Insulation Layer (nm) |
|---|---|
| 150 | 137 |
| 200 | 100 |

According to Table 1, step height 108 of the insulation layer 106a after etching is smaller if the volumetric flow of nitrogenous gas into the reaction chamber during the etching operation is greater. In other words, planarity of the insulation layer 106a increases according to the amount of gaseous nitrogen passed into the reaction chamber. By controlling the rate of flow of the nitrogenous gas or gas mixture, etching rate of the bumps 110b above the insulation layer 106 can be increased to a level higher than the etching rate of the recess regions 110a. Hence, the desired planarity for the oxide insulation layer 106 can be obtained.

In addition, some gaseous oxygen can also be mixed together with the nitrogenous gas in the isotropic chemical dry etching operation.

In brief, the planarizing method of this invention is able to do away with the chemical-mechanical polishing operation. Moreover, a thinner layer of silicon oxide needs to be deposited over a substrate to obtain the same level of planarity as in a conventional process. Hence, cost of production can be reduced.

Figure 2A:
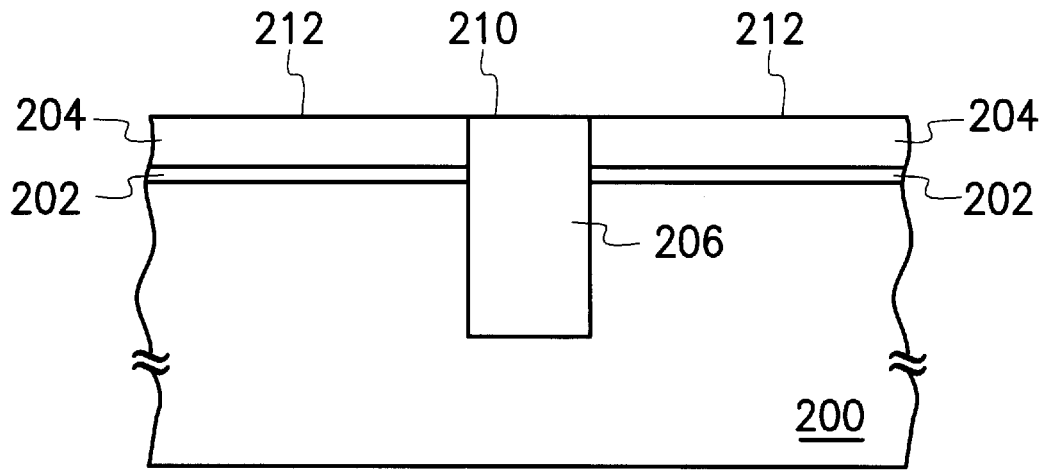
FIGS. 2A through 2C are schematic, cross-sectional views showing the steps for manufacturing a trench isolation structure with the application of an isotropic chemical dry etching operation according to this invention.
Figure 2B:
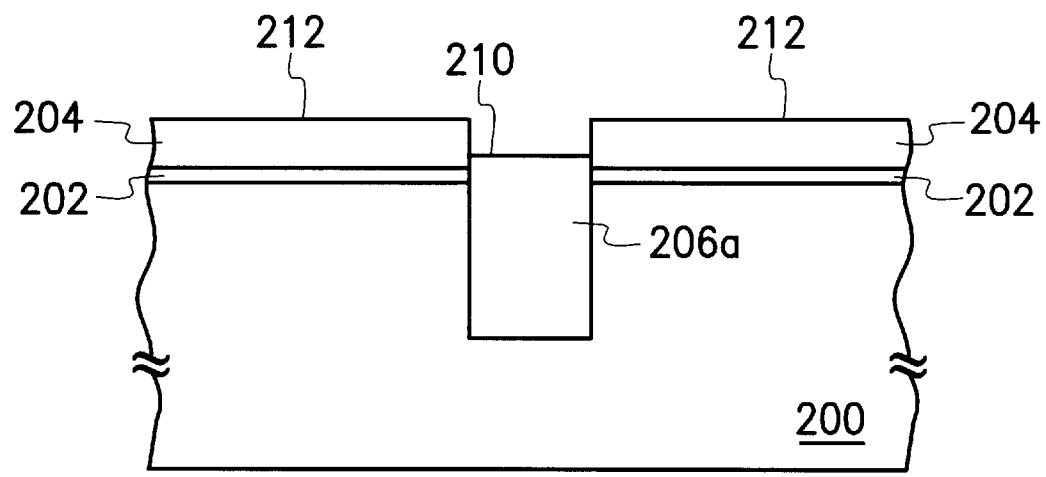
Figure 2C:
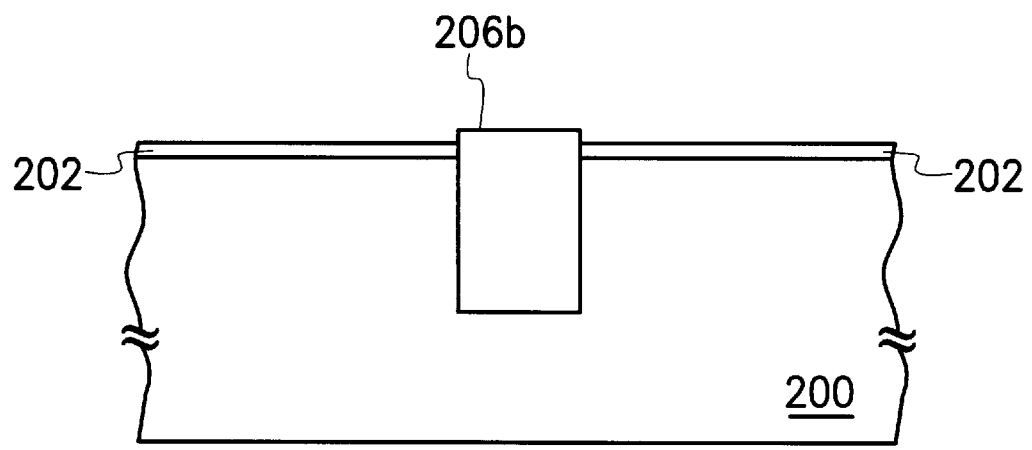

The planarization method of this invention can also be applied during the fabrication of a trench isolation structure. FIGS. 2A through 2C are schematic cross-sectional views showing the steps for manufacturing a trench isolation structure with the application of an isotropic chemical dry etching operation according to this invention.

As shown in FIG. 2A, a substrate 200 having a pad oxide layer 202 and a mask layer 204 thereon is provided. The substrate 200 can be a semiconductor silicon substrate. Next, a trench is formed, passing through the pad oxide layer 202 and the mask layer 204, and into the substrate 200. Thereafter, an oxide plug 206 is formed inside the trench. The oxide plug 206 is preferably formed using silicon oxide ($Si_xO_y$) or silicon oxide-based material. Subsequently, the oxide plug surface 210 and the mask layer surface 212 are planarized in a chemical-mechanical polishing (CMP) operation.

Before the mask layer 204 is removed, densification of the oxide plug 206 is usually carried out at a temperature of around 1000° C. Thereafter, a wet etching operation is conducted to remove a portion of the oxide plug 206. Hence, the upper surface of the oxide plug 206 remains at a small enough height level above the substrate 200 surface when the mask layer is removed so that surface planarity is not be affected. However, a densification operation takes considerable time. Nevertheless, if the oxide plug 206 is etched directly without the densification operation, the central portion of the oxide plug 206 will have a higher etching rate than its surrounding area. Consequently, a recess is generally formed in the middle of the oxide plug 206. When some of the polysilicon material for forming the gate electrode of a device is subsequently deposited into the recess area above the oxide plug 206, abnormal conduction of the device may result.

To prevent the recess in the central region of the oxide plug 206 from causing abnormal conduction, an isotropic chemical dry etching operation similar to the first embodiment is performed. The isotropic chemical dry etching operation is carried out to remove a portion of the oxide layer 206 after the chemical-mechanical polishing operation but prior to the removal of the mask layer 204. Ultimately, an oxide plug 206a having a structure as shown in FIG. 2B is formed. Note that the upper surface 210 of the oxide plug 206a is at a level slightly lower than the surface 212 of the mask layer 204. Since the conditions for carrying out the isotropic chemical dry etching operation are similar to the first embodiment of this invention, detailed description is not repeated here.

By performing the oxide etching method of this invention after the CMP operation, there is no need to densify the oxide plug 206. Hence, a single processing step is eliminated from the fabrication of trench isolation structure.

As shown in FIG. 2C, a wet etching operation is carried out to remove the mask layer 204. Subsequently, other processes necessary for forming a complete circuit are conducted. Since these other processes are familiar to the people working in the semiconductor industry, detailed description is omitted here.

In summary, major aspects of this invention include:

1. An isotropic chemical dry etching operation is used in the invention to planarize an oxide layer above a substrate.

2. By adjusting the flow of processing gas into the reaction chamber during an isotropic chemical dry etching operation, the etching rate in the high areas of the oxide layer is greater than the etching rate in the recessed regions. Consequently, the desired level of planarity for the oxide layer can be obtained.

3. The processing gas used in the isotropic chemical dry etching operation of this invention is nitrogenous gas. The nitrogenous gas can be nitrogen and nitrogen-oxygen compound, and the nitrogen-oxygen compound includes nitrogen monoxide, nitrogen dioxide or nitrous oxide.

4. The processing gas used in the isotropic chemical dry etching operation can even be a mixture of nitrogenous gas and oxygen.

5. The oxide planarization method of this invention can do away with chemical-mechanical polishing operation entirely. In addition, a thinner layer of oxide can be deposited over the substrate to produce a level of planarity similar to that produced in the conventional method. Therefore, cost of production can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for planarizing an oxide layer, comprising the step of:
   etching back the oxide layer to planarize the oxide layer using a nitrogenous compound as a processing gas, wherein the nitrogenous compound comprises nitrogen and a desired level of planarity is achieved by adjusting a volumetric flow rate of the nitrogen, and wherein no chemical-mechanical polishing (CMP) is conducted to planarize the oxide layer.

2. The process of claim 1, wherein the nitrogenous compound is selected from a group comprising nitrogen and a nitrogen-oxygen compound.

3. The process of claim 2, wherein the nitrogen-oxygen compound is selected from a group comprising nitrogen monoxide, nitrogen dioxide and nitrous oxide.

4. The process of claim 1, wherein the processing gas further includes oxygen.

5. A process for planarizing an oxide layer, comprising the steps of:

providing a substrate having a rugged surface layer;

depositing oxide material over the substrate and the rugged surface layer; and planarizing the oxide layer by performing an etch back process using a nitrogenous compound comprising nitrogen as a processing gas, wherein a desired level of planarity is achieved by adjusting a volumetric flow rate of the nitrogen.

6. The process of claim 5, wherein the rugged upper surface of the substrate is due to the presence of a plurality of conductive line structures.

7. The process of claim 5, wherein the rugged upper surface of the substrate is due to the presence of a plurality of MOS transistor structures.

8. The process of claim 5, wherein the nitrogenous processing gas is selected from a group comprising nitrogen and a nitrogen-oxygen compound.

9. The process of claim 8, wherein the nitrogen-oxygen compound is selected from a group comprising nitrogen monoxide, nitrogen dioxide and nitrous oxide.

10. The process of claim 5, wherein the processing gas further includes oxygen.

11. A method for manufacturing a trench isolation structure, comprising the steps of:

providing a substrate having a mask layer thereon, wherein an oxide plug is also formed to pass through the mask layer and into the substrate such that the upper surfaces of both the oxide plug and the mask layer are at the same level;

etching back the oxide plug using a nitrogenous compound comprising nitrogen as a processing gas, wherein a desired level of planarity is achieved by adjusting a volumetric flow rate of the nitrogen; and removing the mask layer.

12. The method of claim 11, wherein the nitrogenous processing gas is selected from a group including nitrogen and nitrogen-oxygen compound.

13. The method of claim 12, wherein the nitrogen-oxygen compound is selected from a group including nitrogen monoxide, nitrogen dioxide and nitrous oxide.

14. The method of claim 11, wherein the processing gas further includes oxygen.

15. The method of claim 5, wherein the rugged surface layer layer includes conductive lines.

* * * * *